United States Patent [19]

Kobashi et al.

[11] Patent Number: 5,358,754
[45] Date of Patent: Oct. 25, 1994

[54] METHOD FOR FORMING DIAMOND FILMS BY VAPOR PHASE SYNTHESIS

[75] Inventors: Koji Kobashi; Shigeaki Miyauchi; Kozo Nishimura; Kazuo Kumagai; Rie Kato, all of Kobe, Japan

[73] Assignee: Kabushiki Kaisha Kobe Seiko Sho, Kobe, Japan

[21] Appl. No.: 908,084

[22] Filed: Jul. 6, 1992

[30] Foreign Application Priority Data

Jul. 9, 1991 [JP] Japan .................. 3-195811

[51] Int. Cl.$^5$ .................. B05D 3/06; C23C 16/50
[52] U.S. Cl. .................. 427/577; 427/249; 427/255.3
[58] Field of Search .................. 427/249, 255.1, 255.3, 427/573, 575, 577; 423/446

[56] References Cited

U.S. PATENT DOCUMENTS

| 4,434,188 | 2/1984 | Kamo et al. . |
| 4,622,121 | 11/1986 | Wegmann et al. ............. 204/398.18 |
| 4,664,760 | 5/1987 | Jarrett ..................... 204/67 |
| 4,767,608 | 8/1988 | Matsumoto et al. ................. 427/39 |
| 4,816,286 | 3/1989 | Hirose ..................... 427/577 |
| 4,869,923 | 9/1989 | Yamazaki . |
| 4,958,590 | 9/1990 | Goforth . |
| 5,007,373 | 4/1991 | Legg et al. . |
| 5,068,871 | 11/1991 | Uchida et al. ..................... 427/249 |
| 5,131,941 | 7/1992 | Lemelson ..................... 75/10.19 |

FOREIGN PATENT DOCUMENTS

| 0327051 | 8/1989 | European Pat. Off. . |
| 0392125 | 10/1990 | European Pat. Off. . |
| 0402039 | 12/1990 | European Pat. Off. . |
| 0413974 | 2/1991 | European Pat. Off. . |
| 0457076 | 11/1991 | European Pat. Off. . |
| 0459807 | 12/1991 | European Pat. Off. . |
| 0470531 | 2/1992 | European Pat. Off. . |
| 61-158899 | 7/1986 | Japan . |
| 01201096 | 8/1989 | Japan . |
| 02289493 | 11/1990 | Japan . |
| 2128637 | 5/1984 | United Kingdom . |

OTHER PUBLICATIONS

Patent Abstracts of Japan, vol. 14, No. 337 (C-748), Aug. 15, 1990, & JP-A-2-138-469, May 28, 1990, Yuichi Ishikawa, et al., "Material for Vacuum Having Diamond Surface Treatment of This Material for Vacuum Production, of Diamond Film Surface, Vacuum Vessel and Its Parts Formed by Using Material for Vacuum, In-Vacuum Driving Mechanism, Electron Release Source" . . .

Patent Abstracts of Japan, vol. 14, No. 342 (C-743), & JP-A-2-125-874, May 14, 1990, Toshimichi Ito, et al., "Manufacture of Thin Film of Diamonds".

*Primary Examiner*—Shrive Beck
*Assistant Examiner*—Bret Chen
*Attorney, Agent, or Firm*—Oblon, Spivak, McClelland, Maier, & Neustadt

[57] ABSTRACT

A method for forming diamond films by vapor phase synthesis comprising a process of forming the diamond films on a substrate by direct current discharge plasma, in an atmosphere of a reaction gas including a gas containing at least carbon and hydrogen, or in an atmosphere of a mixed gas containing at least a carbon-containing gas and a hydrogen gas, at a gas pressure between 0.1 and 5 Torr and a substrate temperature between 300° and 1000° C.

2 Claims, 3 Drawing Sheets

METHOD FOR FORMING DIAMOND FILMS BY VAPOR PHASE SYNTHESIS

BACKGROUND OF THE INVENTION

1. Field of the Invention

The present invention relates to a method for forming high quality diamond films containing little amount of non-diamond components at low temperature by vapor phase synthesis, which are used as a novel material for semiconductors having a resistance against harsh environments and for optical coatings.

2. Description of the Related Art

For diamond growth by vapor phase synthesis, a reaction gas containing hydrogen and carbon is decomposed to deposit a diamond film on a substrate. Generally, the deposited film contains a diamond component and non-diamond components; however, the non-diamond components are etched by atomic hydrogen and thus the diamond component is predominantly deposited.

In a known technique of forming diamond films by direct current plasma chemical vapor deposition (CVD) using such an apparatus as shown in FIG. 4, a reaction gas is decomposed by a direct discharge plasma generated in an atmosphere of the reaction gas at approximately 200 Torr. This technique is disclosed in Journal of Institute of Electrical Engineers, vol. 106, No. 12, pp. 1211 (1986), and Japanese Patent Laid-open No. sho 63-85094.

In the apparatus as shown in FIG. 4, a reaction chamber 1 is evacuated by an exhaust pump (not shown) through an exhaust port 2, and is maintained at a specified vacuum. A disk cathode 3 is held from the upper wall of the chamber 1 through a bar shaft part 3a, and a disk anode 4 is disposed on the bottom wall of the chamber 1 through a shaft part 4a. In the above, both the shaft parts 3a and 4a are electrically insulated from the chamber 1, and the cathode 3 and anode 4 are disposed oppositely in parallel to each other.

A reaction gas inlet 5 is disposed with the gas port thereof located near the cathode 3. A viewing port 6 is disposed at the central portion of the side wall of the chamber 1, through which the interior of the chamber 1 can be observed from the outside. The cathode 3 is connected to a negative power source 7, and the anode 4 is grounded through a current meter 8. A substrate 10 is placed on the anode 4 and is heated by a heater (not shown).

In operation, the substrate 10 is placed on the anode 4, after which the chamber 1 is evacuated through the exhaust port 2 and fed with a reaction gas containing hydrogen and carbon through the gas inlet 5. The substrate 10 is then heated at a temperature of approximately 600° C. or more, and a direct current discharge is induced in an atmosphere of a reaction gas at approximately 200 Torr. Thus the reaction gas is decomposed and the diamond film is deposited on the substrate. In general, the deposited film contains a diamond component and non-diamond components; however, the non-diamond components are etched by atomic hydrogen and thus the diamond component is predominantly deposited.

As described above, in the conventional technique of forming diamond films by vapor phase synthesis, a substrate needs to be heated at a high temperature of 600° C. or more. However, in such a high temperature range, substrates of low melting point metals such as aluminum, and III-V compound semiconducting materials such as gallium arsenide (GaAs) cannot be used. Namely, during the diamond film formation, the aluminum substrate is melted or deformed because of its low melting point; the GaAs substrate is changed in composition because of the evaporation of gallium; if silicon semiconductor devices are used as substrates for diamond overgrowth, they are damaged by the high temperature. Therefore, it is impossible to use the above materials as the substrate. Furthermore, when silicon semiconductor devices are hybridized with diamond films, the diamond growth temperature is restricted to be 450° C. or less because of the poor thermal resistance. Accordingly, the diamond films, notwithstanding its excellent resistance against harsh environments, have been not used as protective films for silicon semiconductor devices or the like.

SUMMARY OF THE INVENTION

It is therefore the object of the present invention to provide a method for forming diamond films by vapor phase synthesis wherein the diamond films can be formed on materials having low melting points, or being susceptible to heat, at lower temperatures than in the conventional method.

To achieve the above object, in the aspect of the present invention, there is provided a method for forming diamond films by vapor phase synthesis comprising a process of forming the diamond films on substrates by direct current discharge plasma, in an atmosphere of a reaction gas including a gas containing at least carbon and hydrogen, or in an atmosphere of a mixed gas containing at least a carbon-containing gas and a hydrogen gas, at a gas pressure between 0.1 and 5 Torr and at a substrate temperature between 300° and 1000° C.

In the above, the reaction gas may further contain helium gas and/or argon gas, and the direct current discharge plasma is preferably generated by an electron beam-assisted plasma apparatus using a concave cathode.

The function of the present invention will be explained prior to the detailed description of the preferred embodiments.

In the present invention, an electron beam is irradiated to a reaction gas at a gas pressure between 0.1 and 5 Torr to form a diamond film by vapor phase synthesis. In such a pressure region, since the electron beam collides with the sample surface to chemically activate the absorption atoms, etching reactions of non-diamond components is promoted even at low substrate temperatures, to hence result in a high quality diamond film. In this case, for a reaction gas pressure less than 0.1 Torr, the plasma is less liable to be produced. On the other hand, for a reaction gas pressure more than 5 Torr, it is difficult to stabilize the discharge. Therefore, the reaction gas pressure must be controlled in a range between 0.1 and 5 Torr.

FIG. 1 is a graph showing a relationship between the reaction gas pressure and the deposition rate. In the figure, the ordinate indicates the deposition rate and the absicssa indicates the reaction gas pressure. The data shown in FIG. 1 are obtained under a condition of an atmosphere of a mixed gas of 99.5 vol % hydrogen and 0.5 vol% methane and a substrate temperature of 400° C. As is apparent from the data, for a reaction gas pressure ranging between 0.1 and 5 Torr, a high deposition rate can be obtained. By use of the reaction gas further added with a helium gas or an argon gas, the discharge can be stabilized thereby further increasing the plasma density.

By use of the concave cathode, an electron is self-focussed to increase the electron density in the electron beam, thus promoting decomposition of the reaction gas due to collisions of the electrons with the gas molecules. Thus, it is possible to increase the plasma density even at low reaction gas pressures, and hence to further facilitate the decomposition of the reaction gas at low gas pressures.

In the present invention, since the reaction gas is decomposed by the electron irradiation at a low gas pressure between 0.1 and 5 Torr, it is possible to obtain a significantly high deposition rate even at such a low substrate temperature as between 300° and 400° C.

FIG. 2 is a graph showing a relationship between the substrate temperature and the deposition rate. In the figure, the ordinate indicates the substrate temperature and the absicssa indicates the deposition rate. The data as shown in FIG. 1 are obtained under a condition of an atmosphere of a mixed gas of 99.5 vol% hydrogen and 0.5 vol% methane at a reaction gas pressure of 0.1 Torr. It is seen that, while the decomposition rate is higher at higher temperatures between 600° and 1000° C. it is still significantly high even at low temperatures, between 300° and 400° C. than in the conventional method.

DETAILED DESCRIPTION OF THE PREFERRED EMBODIMENTS

The exemplary embodiments of the present invention will be described in detail with reference to the accompanying drawings.

Figure 1:
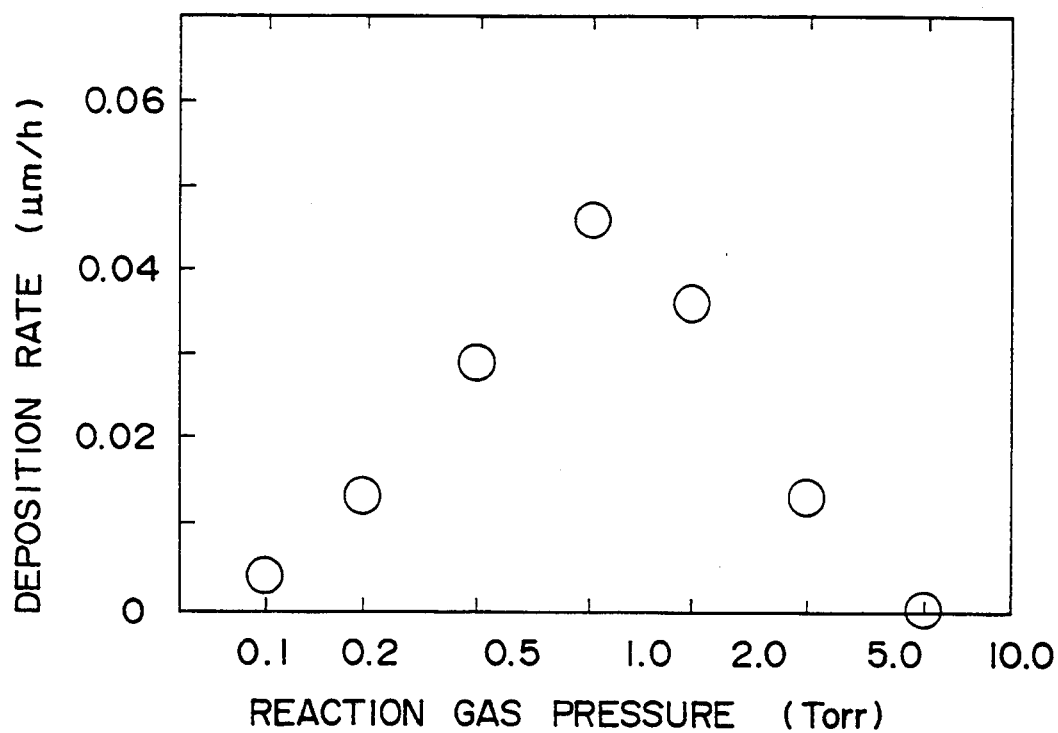
FIG. 1 is a graph showing a relationship between the reaction gas pressure and the deposition rate.
Figure 2:
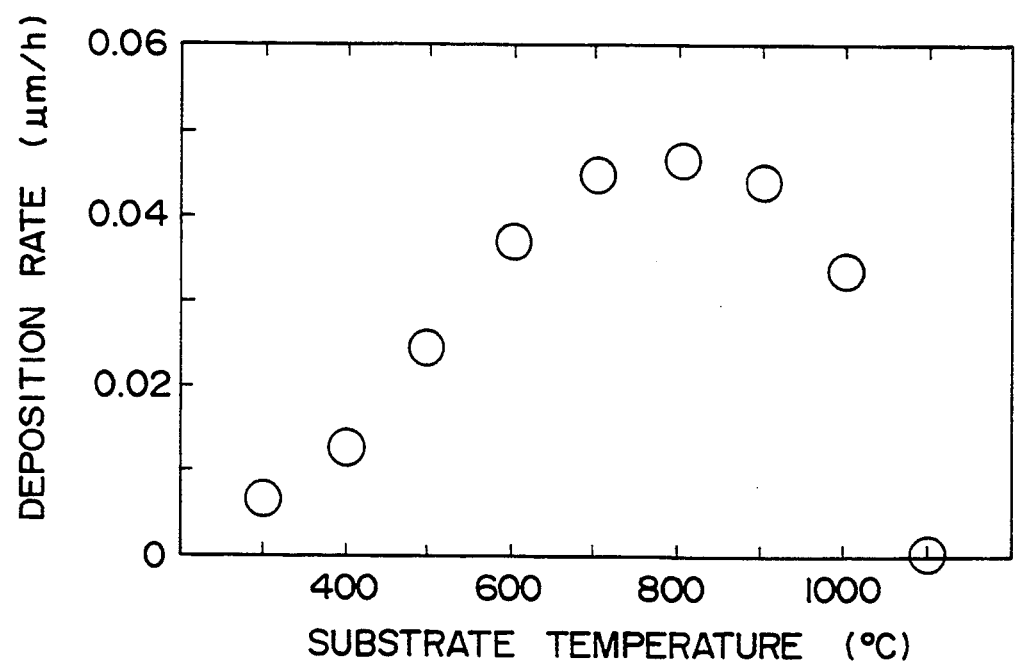
FIG. 2 is a graph showing a relationship between the substrate temperature and the deposition rate.
Figure 3:
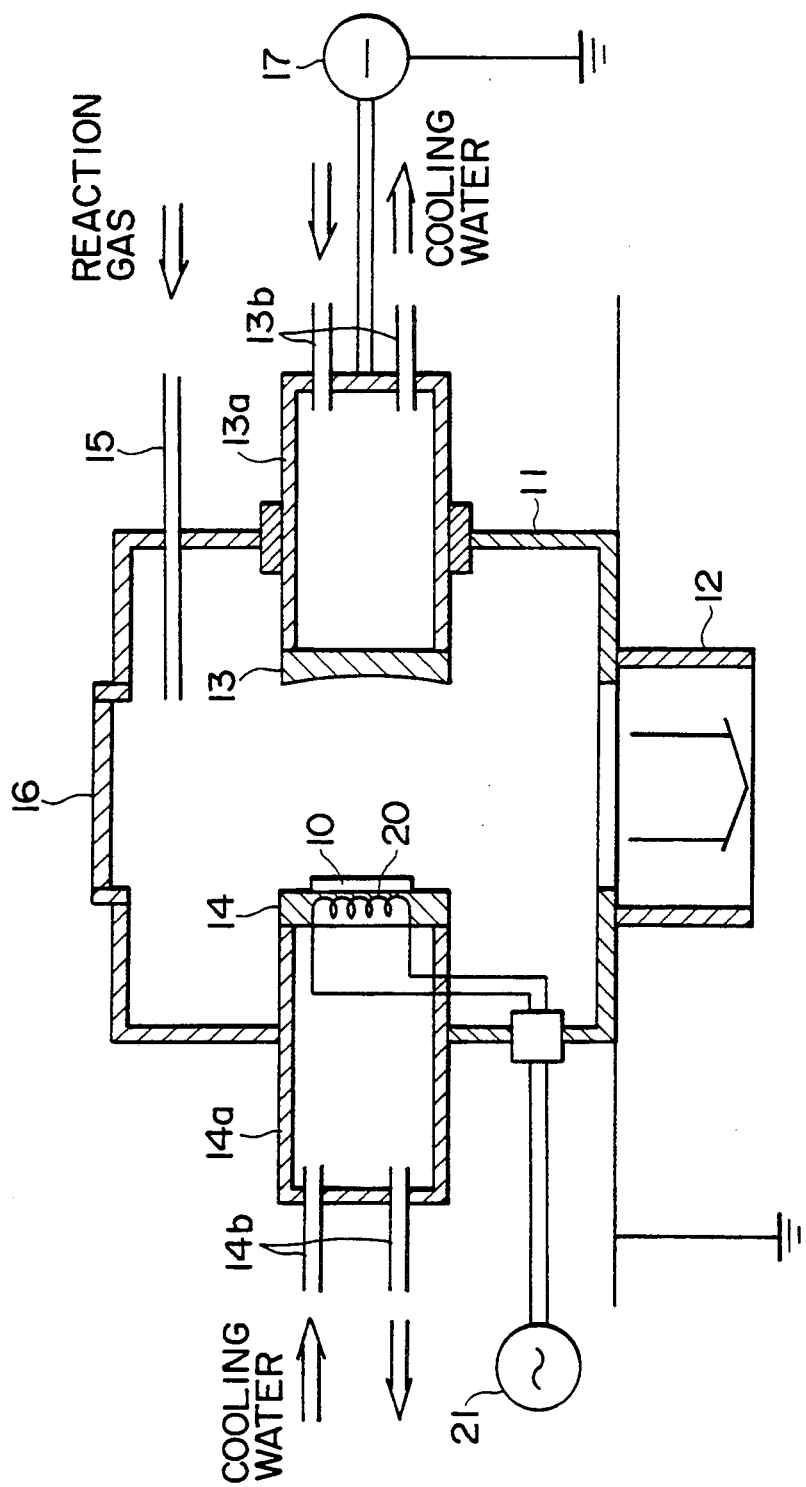
FIG. 3 is a view showing a direct current plasma CVD apparatus used in the embodiments of the present invention.
Figure 4:
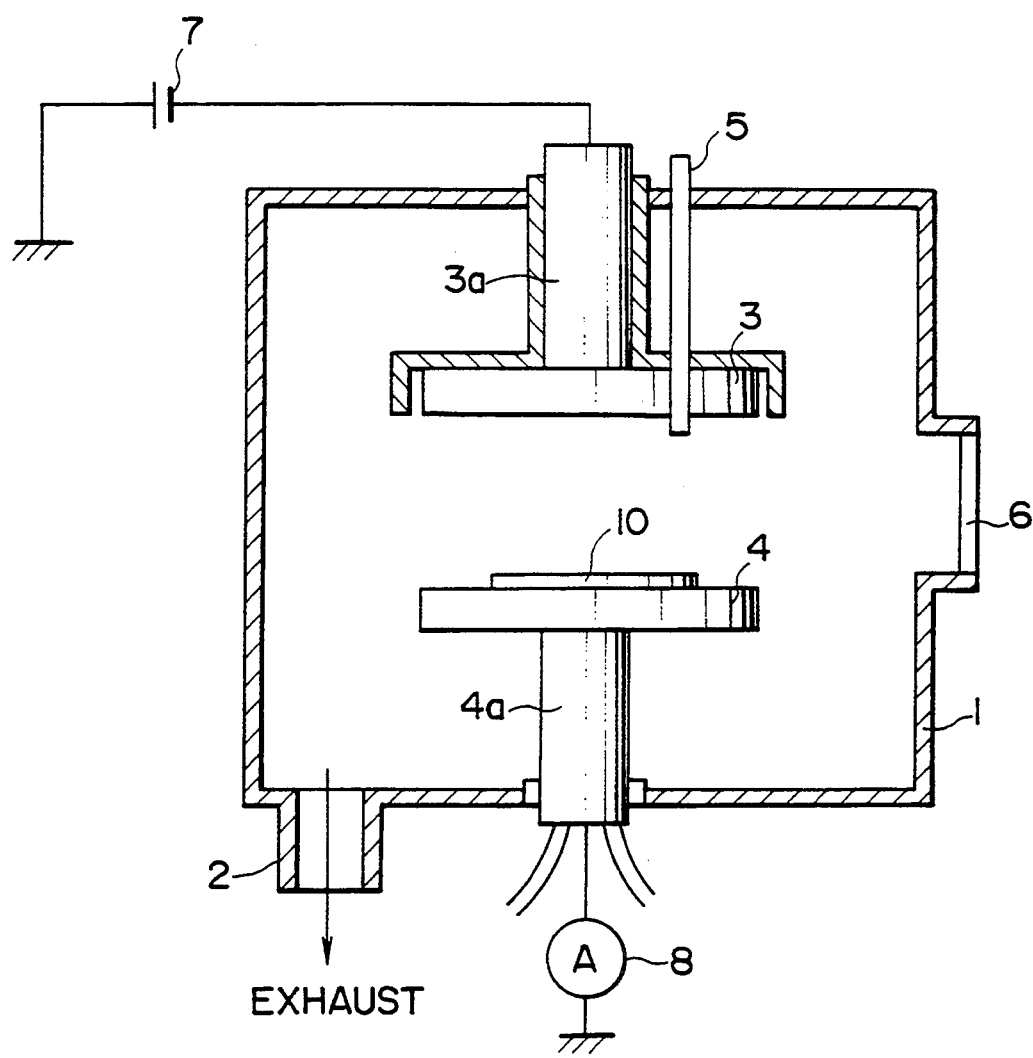
FIG. 4 is a conventional direct current plasma CVD apparatus.

Referring to FIG. 3, a viewing port 16 is provided on the upper wall of a chamber 11 which is grounded, and an exhaust port 12 is provided on the bottom wall thereof. The chamber 11 is evacuated through the exhaust port 12. A reaction gas inlet 15 is disposed on the upper side wall of the chamber 11.

A substrate holder 14 and a cathode 13 are disposed on a pair of opposed side walls of the chamber 11 through a substrate holding case 14a and a cathode case 13a, respectively. The substrate holding case 14 and the cathode case 13a are internally circulated with cooling water through pipes 14b and 13b, respectively. The substrate holding case 14a is brought in contact with the chamber 11 which is grounded. The flat substrate holder 14 is vertically mounted to the substrate holding case 14a at the extreme end thereof projecting in the chamber 11. A heater 20 is embedded within the substrate holder 14, and is connected to an external power supply 21. The heater 20 is applied with current from the power supply 21 for heating the substrate holder 14. A substrate 10 is placed on the substrate holder 14.

The cathode case 13a is electrically insulated from the chamber 11, and is connected to a negative power supply 17. A cathode 13 is mounted to the cathode case 13a at the extreme end thereof projecting in the chamber 11 while being opposed to the substrate holder 14. The cathode 13 has a concave surface, and is connected to the negative high voltage power supply 17 through the cathode case 13a.

In operation, a substrate 10 is mounted on the substrate holder 14, after which the chamber 11 is evacuated to a high vacuum through the exhaust port 12. A specified reaction gas is then fed within the chamber 11 through a gas inlet 15. Thus the chamber 11 is brought into an atmosphere of the reaction gas at a specified gas pressure (between 0.1 and 5 Torr). The substrate 10 is then heated at a specified temperature (between 300° and 1000° C.) by means of the heater 20, and the reaction gas is decomposed thereby forming a diamond film on the substrate.

In the above, since the cathode 13 has the concave surface, electrons irradiated from the cathode 13 to the substrate holder 14 is self-focussed, thereby increasing the electron density in the electron beam. This promotes the decomposition of the reaction gas due to collisions of the electrons with the gas molecules, thus increasing the plasma density. Furthermore, at a low gas pressure, the electron beam collides with the sample surface to chemically activate adsorped atoms. As a result, even at low substrate temperatures, etching reactions with non-diamond components is promoted, resulting in the formation of high quality diamond films.

By use of the reaction gas further added with helium gas or argon gas, the discharge is stabilized, and thereby the plasma density can be further increased.

The present invention is more particularly described by way of examples.

EXAMPLE 1

Prior to the film formation, a silicon wafer substrate was polished with a diamond paste of a particle size of 0.25 μm for 30 minutes. The film growth was carried out in an atmosphere of a mixed gas consisting of 0.5 vol% methane gas and 99.5 vol% hydrogen gas at a gas pressure of 1.0 Torr. The substrate temperature was maintained at 400° C. by a supply power of approximately 600 W. The above procedure was continued for 8 hours, as a result of which a film having a diameter of 2 cm and a film thickness of 0.2 μm was formed. The film was subjected to an observation of its surface morphology and a Raman spectroscopy analysis. The results showed that the film thus obtained was a high quality diamond film.

EXAMPLE 2

The film formation was repeated in the same manner as in Example 1, except for using a reaction gas of a mixed gas consisting of 1.0 vol% methane gas, 49 vol% hydrogen gas and 50 vol% helium gas. The substrate temperature was maintained at 400° C. by a supply power of approximately 500 W. Thus, after 8 hours, a film having a diameter of 2 cm and a thickness of 0.15 μm was formed. The film was subjected to an observation of its surface morphology and a Raman spectroscopy analysis. The results showed that the film thus obtained was a high quality diamond film.

EXAMPLE 3

The film formation was repeated in the same manner as in Example 1, except for using a reaction gas of a mixed gas consisting of 2.0 vol% methane gas, 47.9 vol% hydrogen gas, 0.1 vol% oxygen gas and 50 vol% helium gas. The substrate temperature was maintained at 400° C. by a supply power of approximately 550 W. Thus, after 8 hours, a film having a diameter of 2 cm and a thickness of 0.1 μm was formed. The film was subjected to an observation of its surface morphology and a Raman spectroscopy analysis. The results showed that the film thus obtained was a high quality diamond film.

As mentioned above, according to the present invention, it is possible to form high quality diamond films on substrates at lower temperatures than in the conventional method.

Incidentally, the reaction gas is not particularly limited but contains at least carbon, and accordingly, include various gases other than the methane gas mentioned above, for example, hydrocarbon gases such as ethanol, carbon dioxide, carbon monoxide and the like.

What is claimed is:

1. A method for forming diamond films by vapor phase synthesis comprising forming a diamond film on a substrate using a DC plasma discharge chemical vapor deposition reactor with a concave cathode in an atmosphere of a reaction gas mixture containing methane, oxygen and hydrogen at a gas pressure between 0.1 and 5 Torr and a substrate temperature between 300° and 1000° C.

2. The method of forming diamond films according to claim 1, wherein said reaction gas mixture further contains helium gas.

* * * * *